(12) United States Patent
Somervell

(10) Patent No.: US 7,595,146 B1
(45) Date of Patent: Sep. 29, 2009

(54) METHOD OF CREATING A GRADED ANTI-REFLECTIVE COATING

(75) Inventor: Mark H. Somervell, Austin, TX (US)

(73) Assignee: Tokyo Electron Limited, Tokyo (JP)

(*) Notice: Subject to any disclaimer, the term of this patent is extended or adjusted under 35 U.S.C. 154(b) by 58 days.

(21) Appl. No.: 12/059,459

(22) Filed: Mar. 31, 2008

(51) Int. Cl.
G03F 1/00 (2006.01)
B05B 3/00 (2006.01)

(52) U.S. Cl. .............. 430/327; 430/271.1; 430/273.1; 430/322; 430/935; 427/335; 427/336; 427/402

(58) Field of Classification Search ............. 430/273.1, 430/272.1, 322, 327, 935; 427/335, 336, 427/402
See application file for complete search history.

(56) References Cited

U.S. PATENT DOCUMENTS 6,767,692 B1 * 7/2004 Young et al. ............... 430/311
2008/0008955 A1 * 1/2008 Brodsky et al. ............ 430/270.1

* cited by examiner

*Primary Examiner*—Thorl Chea
(74) *Attorney, Agent, or Firm*—Wood, Herron & Evans, LLP

(57) ABSTRACT

A method of creating a graded anti-reflective coating (ARC) layer on a thin film is described. The method includes forming the thin film on a substrate, forming an ARC layer on the thin film, and applying a solvent to the ARC layer causing it to swell. A photo-resist layer is formed on the swollen ARC layer. A mixing layer is formed by the diffusion of components from the swollen ARC layer to the photo-resist layer and vice versa. The mixing layer has optical qualities that are distinct from those of either of the ARC layer or the photo-resist layer. The mixing layer forms the graded ARC layer.

19 Claims, 2 Drawing Sheets

METHOD OF CREATING A GRADED ANTI-REFLECTIVE COATING

BACKGROUND OF THE INVENTION

1. Field of the Invention

The present invention relates to a method of creating a graded anti-reflective coating (ARC) layer in a single step, and more particularly to a method of modifying the transport properties of an ARC layer with solvents to achieve controlled intermixing with a photo-resist layer.

2. Description of the Related Art

Conventional semiconductor processing involves the application and selective removal of a series of layers, such as light sensitive layers, i.e., photo-resist layers, and anti-reflective coating (ARC) layers, from a semiconductor substrate in a process known as lithography. In general, lithographic processing of a semiconductor substrate involves application of a thin layer of light-sensitive photo-resist to an upper surface of a substrate that is subsequently patterned in order to provide a mask for transferring this pattern to the underlying thin film on a substrate during etching. The patterning of the photo-resist generally involves exposure by a radiation source through a reticle (and associated optics) of the light-sensitive material using, for example, a photo-lithography system, followed by the removal of the irradiated regions of the light-sensitive material (as in the case of positive photo-resist), or non-irradiated regions (as in the case of negative resist) using a developing solvent. Radiation reflected off the layers underlying the photo-resist layer during the exposure step can introduce defects into the pattern. The underlying ARC layer, also referred to as a bottom anti-reflective coating or BARC layer, prevents the reflection of radiation thereby minimizing defects in the pattern of the photo-resist layer. Additionally, minimizing the reflection of radiation during the exposure step can minimize the critical dimension variation of the geometrical features of a photo-resist pattern.

More recently, in order to meet the increasing demand to produce smaller and more complex features, graded ARC layers have been utilized. Graded ARC layers typically consist of a material having non-constant optical parameters throughout the film. One way to approximate a graded ARC is through repeated applications of individual layers of anti-reflective material to form a multi-layer structure wherein each layer has different optical properties. Each anti-reflective layer requires an additional coating step that increases the cost and time associated with semiconductor fabrication. Therefore, a method of producing a graded ARC layer in a minimal number of coating steps would be advantageous.

SUMMARY OF THE INVENTION

The present invention relates to a method of forming a graded anti-reflective coating (ARC) layer in a thin film lithographic structure.

According to one embodiment, the method includes depositing an anti-reflective material on a thin film to form an ARC layer. The ARC layer is treated with a solvent for a time sufficient to swell at least a portion of the ARC layer and alter the diffusion properties of the anti-reflective material therein to a desired degree. A photo-resist material is then coated over the swollen portion of the ARC layer to form a photo-resist layer. Thereafter, intermixing occurs between an interface portion of the photo-resist material and the swollen portion of the ARC layer by diffusion to form a mixing layer underlying the photo-resist layer. The mixing layer comprises the anti-reflective material and the photo-resist material.

According to another embodiment, the method includes depositing an anti-reflective material on a thin film to form an ARC layer comprising a bulk ARC portion and an interface ARC portion. The ARC layer is treated with a solvent for a time sufficient to swell the interface ARC portion and increase the diffusion properties of the anti-reflective material in the interface ARC portion. A photo-resist material is then coated over the swollen interface ARC portion to form a photo-resist layer having an interface photo-resist portion and a bulk photo-resist portion. The photo-resist layer is then baked to harden the bulk photo-resist portion and to intermix the interface photo-resist portion with the swollen interface ARC portion to form a mixing layer comprising the anti-reflective material and the photo-resist material between the bulk ARC portion and the hardened bulk photo-resist portion.

DETAILED DESCRIPTION OF EXEMPLARY EMBODIMENTS

Figure 1A:
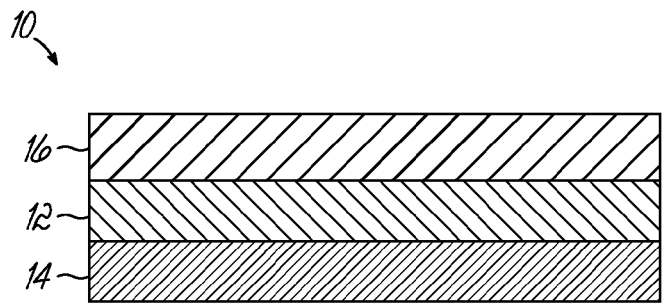
FIGS. 1A through 1D illustrate schematically a method of creating a graded ARC layer in a single ARC layer coating step.

In the following description, for the purposes of explanation and not limitation, specific details are set forth, such as particular processes and patterning systems. However, it should be understood that the invention may be practiced in other embodiments that depart from these specific details.

According to an embodiment, a method of forming a graded anti-reflective coating (ARC) layer in a thin film lithographic structure is described. The method involves the formation of a graded ARC layer from a single ARC layer deposition step by subsequently intermixing at least a portion of the ARC layer with photo-resist material from a photo-resist layer coated over the ARC layer. In the formation of a lithographic structure, a film stack is formed on a substrate, comprising a thin film formed on the substrate, an ARC layer (comprising anti-reflective material) formed on the thin film, and a photo-resist layer (comprising photo-resist material) formed on the ARC layer. In accordance with the invention, the ARC layer can be formed by depositing the anti-reflective material in a single coating step. Prior to forming the photo-resist layer, a solvent is applied to the ARC layer causing at least a portion of the ARC layer to swell. A mixing layer is formed at the interface of the photo-resist layer and the swollen portion of the ARC layer by mixing anti-reflective material from the swollen portion of the ARC layer with photo-resist material from an interface portion of the photo-resist layer. Any unmixed portion of the ARC layer and the mixing layer function as a graded ARC layer.

The film stack may optionally include one or more additional sacrificial layers, such as a hard mask layer, for example, an organic planarization layer (OPL), disposed between the thin film and the ARC layer.

The thin film may comprise a conductive layer, a non-conductive layer, or a semi-conductive layer. For instance, the thin film may include a material layer, or plurality of material layers, comprising a silicon-containing material, such as silicon dioxide, silicon nitride, silicon carbide, or silicon oxynitride, etc. Additionally, for instance, the thin film may comprise a low dielectric constant (i.e., low-k) or ultra-low dielectric constant (i.e., ultra-low-k) dielectric layer having a nominal dielectric constant value less than the dielectric constant of $SiO_2$, which is approximately 4 (e.g., the dielectric constant for thermal silicon dioxide can range from 3.8 to 3.9). More specifically, the thin film may have a dielectric constant of less than 3.7, or a dielectric constant ranging from 1.6 to 3.7.

These dielectric layers may include at least one of an organic, inorganic, or inorganic-organic hybrid material. Additionally, these dielectric layers may be porous or non-porous. For example, these dielectric layers may include an inorganic, silicate-based material, such as carbon doped silicon oxide (or organo siloxane), deposited using chemical vapor deposition (CVD) techniques. Examples of such films include Black Diamond® CVD organosilicate glass (OSG) films commercially available from Applied Materials, Inc., or Coral® CVD films commercially available from Novellus Systems, Inc.

Alternatively, these dielectric layers may include porous inorganic-organic hybrid films comprised of a single-phase, such as a silicon oxide-based matrix having $CH_3$ bonds that hinder full densification of the film during a curing or deposition process to create small voids (or pores). Still alternatively, these dielectric layers may include porous inorganic-organic hybrid films comprised of at least two phases, such as a carbon-doped silicon oxide-based matrix having pores of organic material (e.g., porogen) that is decomposed and evaporated during a curing process.

Still alternatively, these dielectric layers may include an inorganic, silicate-based material, such as hydrogen silsesquioxane (HSQ) or methyl silsesquioxane (MSQ), deposited using spin-on dielectric (SOD) techniques. Examples of such films include FOx® HSQ commercially available from Dow Corning, XLK porous HSQ commercially available from Dow Corning, and JSR LKD-5109 commercially available from JSR Microelectronics. Still alternatively, these dielectric layers can comprise an organic material deposited using SOD techniques. Examples of such films include SiLK-I, SiLK-J, SiLK-H, SiLK-D, and porous SiLK® semiconductor dielectric resins commercially available from Dow Chemical, and GX-3™, and GX-3P™ semiconductor dielectric resins commercially available from Honeywell.

The thin film can be formed using a vapor deposition technique, such as chemical vapor deposition (CVD), plasma enhanced CVD (PECVD), atomic layer deposition (ALD), plasma enhanced ALD (PEALD), physical vapor deposition (PVD), or ionized PVD (iPVD), or a spin-on technique, such as those offered in the Clean Track ACT 8 SOD (spin-on dielectric), ACT 12 SOD, and LITHIUS® coating systems commercially available from Tokyo Electron Limited (TEL). The Clean Track ACT 8 (200 mm), ACT 12 (300 mm), and LITHIUS® (300 mm) coating systems provide coat, bake, and cure tools for SOD materials. The track system can be configured for processing substrate sizes of 100 mm, 200 mm, 300 mm, and greater. Other systems and methods for forming a thin film on a substrate are well known to those skilled in the art of both spin-on technology and vapor deposition technology.

The ARC layer possesses anti-reflective properties suitable for use as an ARC layer. ARC layers are typically created by spin-coating polymers having the desired anti-reflective characteristics onto the thin film and then baking the film stack at high temperatures to cross-link the film. In one embodiment, a thickness of the ARC layer may be between about 50 nanometers and about 100 nanometers. In another embodiment, the thickness of the ARC layer may be between about 20 nanometers and about 50 nanometers. In an alternative embodiment, the thickness of the ARC layer may be between about 100 nanometers and about 300 nanometers. In accordance with the present invention, the ARC layer may be deposited in a single step, for example, a single spin-coating step.

In accordance with present invention, the ARC layer is treated, for example, by applying a solvent to the surface of the ARC layer, to swell at least a portion of the ARC layer. Solvent may swell only an interface portion of the ARC layer or its entire depth. Suitable solvents include any solvent capable of penetrating and swelling the ARC layer. For example, an organic solvent may be used, including propylene glycol methyl ether acetate, ethyl lactate, cyclohexanone, gamma-butyrolactone, or methyl amyl ketone, or any combination thereof. Solvent may be applied to the ARC layer by any method known to one of ordinary skill in the art, such as spin coating, dip coating, or spray coating. The solvent is applied in quantities sufficient to at least coat the portions of the surface the ARC layer wherein a mixing layer is desired, and may be applied in excess. The conditions necessary for sufficient swelling of the ARC layer, i.e., quantity of solvent, exposure time, temperature, etc., will be determined by the individual characteristics of the ARC layer, the photo-resist layer, and the solvent, as well as the desired depth (thickness) and optical characteristics of the resulting mixing layer.

Subsequently, a photo-resist layer is spin coated over the swollen ARC layer. The photo-resist layer may comprise 248 nm (nanometer) resists, 193 nm resists, 157 nm resists, or EUV (extreme ultraviolet) resists. The photo-resist layer can be formed using a track system. For example, the track system can comprise a Clean Track ACT 8, ACT 12, or LITHIUS® resist coating and developing system commercially available from Tokyo Electron Limited (TEL). Other systems and methods for forming a photo-resist layer film on a substrate are well known to those skilled in the art of spin-on resist technology. Following the coating of the photo-resist layer, the resulting thin film lithographic structure is subjected to a post-application bake.

In accordance with the present invention, the solvent penetrates at least a portion of the ARC layer thereby increasing the mass of at least that portion of the ARC layer, thus causing that portion to swell. Solvent penetration into a portion of the ARC layer allows material components from the swollen portion of the ARC layer to diffuse into the interface portion of the photo-resist layer and/or allows the swollen portion to accept diffusing material components from the interface portion of the photo-resist layer thereby forming a mixing layer. Ideally, the solvent used in coating the photo-resist has little effect on the ARC layer since the ARC layer is crosslinked in a post-application bake before the photo-resist layer is formed. However, the swelling of the ARC layer caused by treatment with and penetration of the solvent prior to forming the photo-resist alters the diffusion properties of the swollen portion of the ARC layer (i.e., the ability for chemical/material components to diffuse into and out of the ARC layer changes). As a result, after forming the photo-resist layer, and in the subsequent post-application bake used to solidify the photo-resist layer, the swelling treatment of the ARC layer allows components of the swollen portion of the ARC layer to diffuse into the interface portion of the photo-resist layer, and components of the photo-resist layer to diffuse into the swollen portion of the ARC layer. The diffusion of components between the swollen portion of the ARC layer and the interface portion of the photo-resist layer results in the formation of a mixing layer at the interface of the ARC layer and the photo-resist layer that comprises a mixture of anti-reflective material and photo-resist material. The mixing layer thus has a blend of the chemical and optical properties of the ARC layer and the photo-resist layer.

The diffusion of components between the swollen portion of the ARC layer and the photo-resist layer may result in either a homogenous or graded distribution of components in the mixing layer. For example, under conditions resulting in a homogenous distribution of components, the components will be substantially evenly distributed and the characteristics of the mixing layer will be substantially uniform through the entirety of the mixing layer. In contrast, under conditions resulting in a graded distribution of components in the mixing layer, the portion of the mixing layer closest to the photo-resist layer will have characteristics more similar to the photo-resist layer and the portion of the mixing layer closer to the ARC layer will have characteristics more similar to the ARC layer. Further, during the post-application bake, solvent is driven out of the film stack causing the swollen portion of the ARC layer to contract, in effect un-swelling the previously swollen portion, and thereby changing the diffusion properties back to a state where diffusion of components is limited between the ARC layer and the photo-resist layer.

Controlling the diffusion properties of the ARC layer, thereby controlling the mixing between the swollen portion of the ARC layer and the interface portion of the photo-resist layer, can allow for careful control over the optical properties of the mixing layer. The diffusion properties of the swollen portion of the ARC layer may be controlled by manipulating the exposure of the ARC layer to the solvent. For example, if the ARC layer is treated with solvent for a long period of time prior to coating the photo-resist, the degree and depth of swelling of the ARC layer will be high and will allow for a high degree and depth of diffusion of components from the swollen portion of the ARC layer to the photo-resist and vice-versa. Further, the diffusion properties of the swollen portion of the ARC layer may be manipulated by using different solvents, adding or removing components from the photo-resist and ARC layers, or by manipulating the baking time and temperature. Additional methods of manipulating the diffusion properties of the swollen portion of the ARC layer will be apparent to those having ordinary skill in the art.

The optimal depth (thickness) of the mixing layer into the thickness of the ARC layer will be determined by the desired optical qualities of the mixing layer. In one embodiment, the mixing layer may form to a depth of about 1% to about 100% of the thickness of the ARC layer. In another embodiment, the mixing layer may form to a depth of about 5% to about 80% of the thickness of the ARC layer. In yet another embodiment, the mixing layer may form to a depth of about 10% to about 60% of the thickness of the ARC layer. The mixing layer may be characterized by methods as known to those of ordinary skill in the art, such as chemical composition, optical properties, or both. For example, the mixing layer may defined as the volume at the interface between the ARC layer and the photo-resist layer wherein components from both the ARC layer and the photo-resist layer are found in quantities sufficient to change the optical properties of the mixing layer to be different from the optical properties of either of the ARC layer or the photo-resist layer individually. The thickness (or volume) of the mixing layer may be measured using ellipsometry using a three layer model to extract the optical parameters of the three layers, i.e., the ARC layer, mixing layer, and photo-resist layer, simultaneously.

The invention will now be further described with reference to the figures, in which like reference numerals are used to refer to like parts throughout the several views.

Figure 1B:
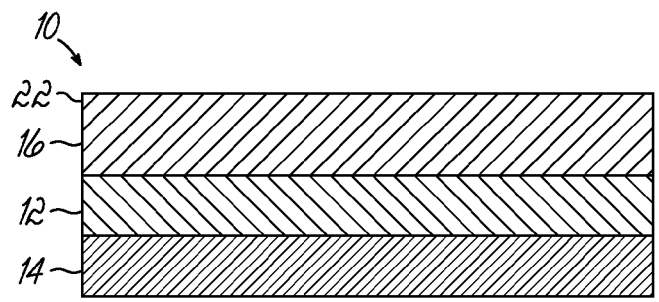

According to an embodiment of the invention, as shown in FIG. 1A, a film stack 10 is formed wherein a thin film 12 is formed on a substrate 14, and an anti-reflective material is deposited/coated on the thin film 12 forming an ARC layer 16. The layers of the film stack 10 may be formed by any method known to one of ordinary skill in the art, such as spin coating or chemical vapor deposition. In accordance with the invention, the ARC layer 16 may be formed in a single coating (deposition) step. The ARC layer 16 is then treated with a solvent to swell at least a portion thereof and thereby alter the diffusion properties of the material. The solvent may be applied to the ARC layer 16 in quantities sufficient to cover the surface of the ARC layer 16 and may be applied with any method known to one of ordinary skill in the art, such as spin coating, dip coating, or spray coating. The ARC layer 16 is exposed to solvent for a period of time sufficient to allow a desired portion of the ARC layer 16 to swell. As depicted in FIG. 1B, in one embodiment, the swollen ARC portion 22 of the ARC layer 16 constitutes the entire depth of the ARC layer 16. The treatment of the ARC layer 16 with solvent should be sufficient to alter the diffusion properties to a degree that allows for the mixing of the desired amount of components between the swollen ARC portion 22 and an interface portion of a subsequently applied photo-resist.

Figure 1C:
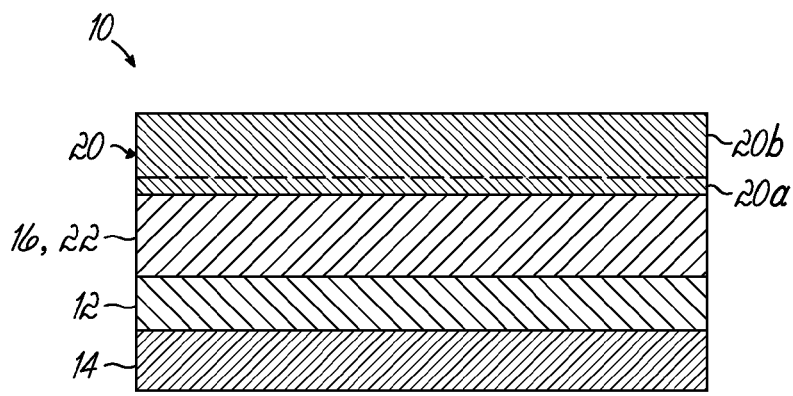

As shown in FIG. 1C, a photo-resist material is applied to the swollen ARC portion 22 forming the photo-resist layer 20. The photo-resist layer 20 is applied using standard coating techniques as known to one of ordinary skill in the art, such as spin coating. The photo-resist layer 20 includes an interface photo-resist portion 20a on the swollen ARC portion 22, and a bulk photo-resist portion 20b.

Figure 1D:
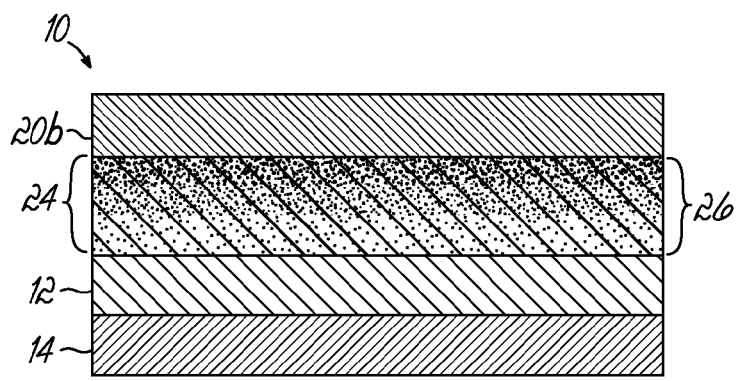

The film stack 10 is then subjected to a post-application bake wherein a mixing layer 24 is formed underlying the bulk photo-resist portion 20b, as shown schematically in FIG. 1D. The mixing layer 24 is formed by components from the swollen ARC portion 22 diffusing into the interface photo-resist portion 20a or components from the interface photo-resist portion 20a diffusing into the swollen ARC portion 22, or both. A graded distribution of components from the photo-resist material of the interface photo-resist portion 20a and the anti-reflective material of the swollen ARC portion 22 is depicted in the mixing layer 24 as graded dithering that extends from the interface with the bulk photo-resist portion 20b through the swollen ARC portion 22. In this embodiment, the entire ARC layer 16 is swollen by treatment with the solvent, and diffusion occurs throughout, such that no un-mixed ARC layer 16 remains underlying the mixing layer 24. In other words, the entire ARC layer 16 intermixes with photo-resist material and becomes the mixing layer 24. The mixing layer 24 thus forms to a depth of 100% of the thickness of the ARC layer 16. Also, as the post-application bake proceeds to completion to harden the bulk photo-resist portion 20b, solvent is forced from the swollen ARC portion 22 and diffusion between the swollen ARC portion 22 and the interface photo-resist portion 20a ceases. The chemical and optical characteristics of the resulting mixing layer 24 will be distinct from the characteristics of either the former ARC layer 16 or the bulk photo-resist portion 20b. In this embodiment, the mixing layer 24 effectively functions as a graded ARC layer 26. In addition, according to an embodiment of the invention, the graded ARC layer 26 has a continuous grading, thereby providing a smooth transition of optical properties throughout its thickness (or volume).

Figure 2A:
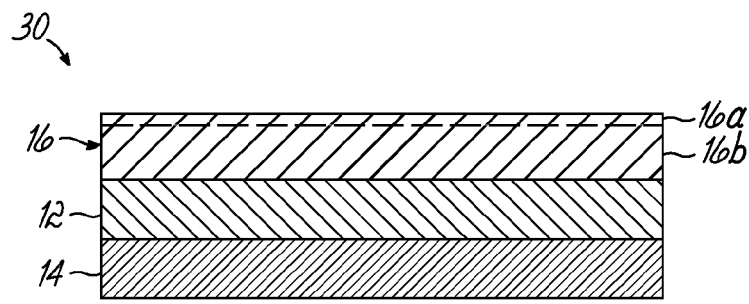
FIGS. 2A through 2D illustrate schematically another method of creating a graded ARC layer in a single ARC layer coating step.

According to another embodiment of the invention, as shown in FIG. 2A, a film stack 30 is formed wherein a thin film 12 is formed on a substrate 14, and an anti-reflective material is deposited/coated (advantageously in a single step)

on the thin film 12 forming an ARC layer 16 having an interface ARC portion 16a and a bulk ARC portion 16b. The layers of the film stack 10 may be formed by any method known to one of ordinary skill in the art, such as spin coating or chemical vapor deposition. The ARC layer 16 is then treated with a solvent to swell the interface ARC portion 16a and thereby alter the diffusion properties of the material. The solvent may be applied to the interface ARC portion 16a in quantities sufficient to cover the surface thereof and may be applied with any method known to one of ordinary skill in the art, such as spin coating, dip coating, or spray coating.

Figure 2B:
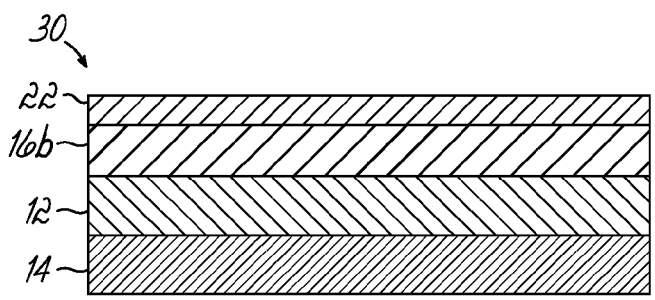

The interface ARC portion 16a is exposed to solvent for a period of time sufficient to allow the interface ARC portion 16a to swell to form a swollen ARC portion 22, as shown in FIG. 2B. The treatment of the interface ARC portion 16a with solvent should be sufficient to alter the diffusion properties to a degree that allows for the mixing of the desired amount of components between the swollen ARC portion 22 and an interface portion of a subsequently applied photo-resist.

Figure 2C:
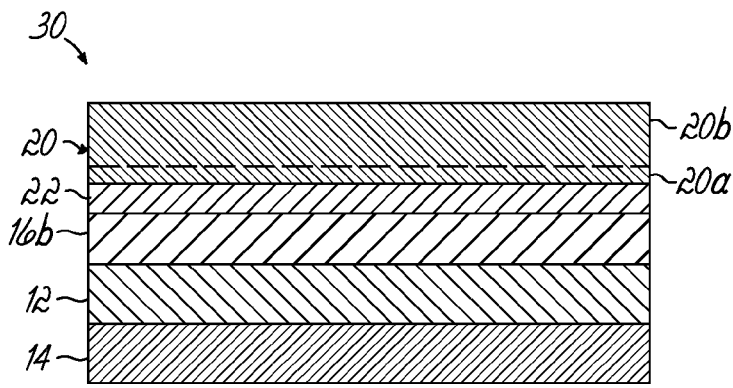

As shown in FIG. 2C, a photo-resist material is applied to the swollen ARC portion 22 forming a photo-resist layer 20 having an interface photo-resist portion 20a and a bulk photo-resist portion 20b. The photo-resist layer 20 is applied using standard coating techniques as known to one of ordinary skill in the art, such as spin coating.

Figure 2D:
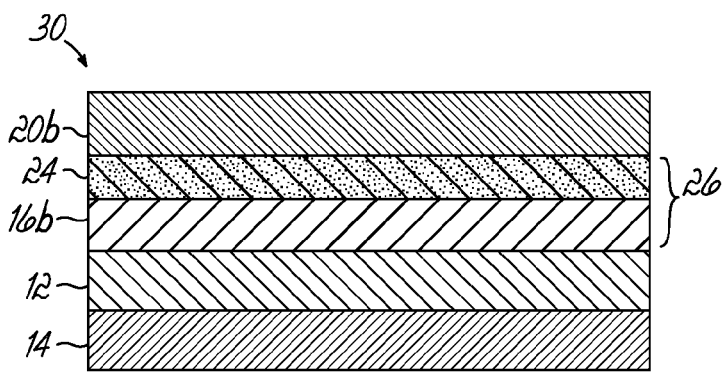

The film stack 30 is then subjected to a post-application bake wherein a mixing layer 24 is formed as an interface layer between the bulk ARC portion 16b and the bulk photo-resist portion 20b, as shown schematically in FIG. 2D. The mixing layer 24 is formed by components from the swollen ARC portion 22 diffusing into the interface photo-resist portion 20a, or components from the interface photo-resist portion 20a diffusing into the swollen ARC portion 22, or both. In this embodiment, the mixing layer 24 may form to a depth of about 1% of the thickness of the ARC layer 16 to about 99% of the thickness of the ARC layer 16. In another embodiment, the mixing layer 24 may form to a depth of about 5% to about 80% of the thickness of the ARC layer 16. In yet another embodiment, the mixing layer 24 may form to a depth of about 10% to about 60% of the thickness of the ARC layer 16.

The mixing layer 24 may comprise a homogeneous distribution of photo-resist material from the interface photo-resist portion 20a and anti-reflective material from the swollen ARC portion 22. Alternatively, the mixing layer 24 may have a graded distribution, as described in FIG. 1D. As the post-application bake proceeds to completion to harden the bulk photo-resist portion 20b, solvent is forced from the swollen ARC portion 22 and diffusion between the swollen ARC portion 22 and the interface photo-resist portion 20a ceases. The chemical and optical characteristics of the resulting mixing layer 24 will be distinct from the characteristics of either the bulk ARC portion 16b or the bulk photo-resist portion 20b. In this embodiment, the bulk ARC portion 16b and the mixing layer 24 together effectively function as a graded ARC layer 26. A stepped grading occurs at the transition from the bulk ARC portion 16b to the mixing layer 24, and the mixing layer 24 itself may have a homogeneous or graded distribution. Thus, the invention contemplates continuous grading (such as shown in FIG. 1D) or stepped grading (such as shown in FIG. 2D), or a combination thereof. Advantageously, the grading is primarily continuous, to provide a smooth transition of optical properties.

The processes schematically illustrated in FIGS. 1A through 2D demonstrate exemplary embodiments in which a graded ARC layer 26 may be formed utilizing a single coating step for ARC layer 16 during the formation of a film stack 10 or 30 and subsequent solvent processing to enable diffusion between the ARC layer 16 and the photo-resist layer 20 to effectively achieve the grading. The method of the invention decreases the expense and costs generally associated with forming a graded ARC layer 26.

Although only certain embodiments of this invention have been described in detail above, those skilled in the art will readily appreciate that many modifications are possible in the embodiments without materially departing from the novel teachings and advantages of this invention. Accordingly, all such modifications are intended to be included within the scope of this invention.

What is claimed is:

1. A method of making a graded anti-reflective coating (ARC) layer in a thin film lithographic structure, comprising:
   depositing an anti-reflective material over a thin film to form an anti-reflective coating (ARC) layer;
   treating the ARC layer with a solvent for a time sufficient to swell at least a portion of the ARC layer and alter diffusion properties of the anti-reflective material to a desired degree;
   coating a photo-resist material over the swollen portion of the ARC layer to form a photo-resist layer; and
   intermixing an interface portion of the photo-resist material and the swollen portion of the ARC layer by diffusion to form a mixing layer underlying the photo-resist layer that comprises the anti-reflective material and the photo-resist material.

2. The method of claim 1 wherein the interface portion of the photo-resist material is intermixed with a swollen interface portion of the ARC layer to form the mixing layer as an interface layer between and an underlying unmixed portion of the ARC layer and an overlying unmixed portion of the photo-resist layer.

3. The method of claim 2 wherein the mixing layer forms to a depth of about 5% to about 80% of a thickness of the ARC layer.

4. The method of claim 2 wherein the mixing layer forms to a depth of about 10% to about 60% of a thickness of the ARC layer.

5. The method of claim 1 wherein the mixing layer forms to a depth of about 1% to about 100% of a thickness of the ARC layer.

6. The method of claim 1 wherein the mixing layer comprises a homogenous distribution of the photo-resist material in the anti-reflective material.

7. The method of claim 1 wherein the mixing layer comprises a graded distribution of the photo-resist material in the anti-reflective material, with a quantity of photo-resist material increasing in a direction from the thin film toward the photo-resist layer.

8. The method of claim 1 wherein the thin film lithographic structure is subjected to a baking step to harden the photo-resist layer, during which the intermixing occurs.

9. The method of claim 1 wherein the solvent is an organic solvent.

10. The method of claim 9 wherein the organic solvent is selected from a group consisting of propylene glycol methyl ether acetate, ethyl lactate, cyclohexanone, gamma-butyrolactone, and methyl amyl ketone, and combinations thereof.

11. The method of claim 1 wherein the ARC layer is deposited in a single coating step.

12. A method of making a graded anti-reflective coating (ARC) layer in a thin film lithographic structure, comprising:
   depositing an anti-reflective material over a thin film to form an anti-reflective coating (ARC) layer comprising a bulk ARC portion and an interface ARC portion;

treating the ARC layer with a solvent for a time sufficient to swell the interface ARC portion and increase diffusion properties of the anti-reflective material in the interface ARC portion;

coating a photo-resist material over the swollen interface ARC portion to form a photo-resist layer having an interface photo-resist portion and a bulk photo-resist portion; and baking the photo-resist layer to harden the bulk photo-resist portion and to intermix the interface photo-resist portion with the swollen interface ARC portion to form a mixing layer comprising the anti-reflective material and the photo-resist material between the bulk ARC portion and the hardened bulk photo-resist portion.

13. The method of claim 12 wherein the interface ARC portion is about 5% to about 80% of a thickness of the ARC layer.

14. The method of claim 12 wherein the interface ARC portion is about 10% to about 60% of a thickness of the ARC layer.

15. The method of claim 12 wherein the mixing layer comprises a homogenous distribution of the photo-resist material in the anti-reflective material.

16. The method of claim 12 wherein the mixing layer comprises a graded distribution of the photo-resist material in the anti-reflective material, with a quantity of photo-resist material increasing in a direction from the bulk ARC portion to the bulk photo-resist portion.

17. The method of claim 12 wherein the solvent is an organic solvent.

18. The method of claim 17 wherein the organic solvent is selected from a group consisting of propylene glycol methyl ether acetate, ethyl lactate, cyclohexanone, gamma-butyrolactone, and methyl amyl ketone, and combinations thereof.

19. The method of claim 12 wherein the ARC layer is deposited in a single coating step.

\* \* \* \* \*